United States Patent
Son et al.

(10) Patent No.: US 7,396,744 B2
(45) Date of Patent: Jul. 8, 2008

(54) METHOD OF FORMING A SEMICONDUCTOR THIN FILM

(75) Inventors: Yonghoon Son, Yongin (KR);
Sungkwan Kang, Seou (KR);
Jongwook Lee, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/481,633

(22) Filed: Jul. 6, 2006

(65) Prior Publication Data

US 2007/0166963 A1   Jul. 19, 2007

(30) Foreign Application Priority Data

Jan. 16, 2006   (KR) .................... 10-2006-0004334

(51) Int. Cl.
*H01L 21/00*   (2006.01)
(52) U.S. Cl. ...................... 438/482; 438/489
(58) Field of Classification Search .......... 438/149, 438/166, 478, 481, 482, 486, 487, 488, 489; 257/67, 70, 75, 347, E21.09; 117/89, 92, 117/108
See application file for complete search history.

(56) References Cited

U.S. PATENT DOCUMENTS

| | | | | |
|---|---|---|---|---|
| 4,489,478 A | * | 12/1984 | Sakurai | 438/18 |
| 5,970,369 A | * | 10/1999 | Hara et al. | 438/488 |
| 6,096,626 A | * | 8/2000 | Smith et al. | 438/478 |
| 6,746,942 B2 | | 6/2004 | Sato et al. | 438/586 |
| 6,815,717 B2 | * | 11/2004 | Horikoshi et al. | 257/64 |
| 6,867,074 B2 | * | 3/2005 | Tsao | 438/149 |
| 6,884,699 B1 | * | 4/2005 | Ogawa et al. | 438/489 |
| 7,326,876 B2 | * | 2/2008 | Jung | 219/121.61 |
| 2005/0277235 A1 | * | 12/2005 | Son et al. | 438/166 |

* cited by examiner

*Primary Examiner*—Brook Kebede
*Assistant Examiner*—Khiem D Nguyen
(74) *Attorney, Agent, or Firm*—F. Chau & Associates, LLC

(57) ABSTRACT

A method of fabricating a semiconductor thin film is provided, comprising: forming an insulation layer on a semiconductor substrate; etching the insulation layer to form a plurality of openings exposing the substrate at the bottom of the openings; filling the openings with a semiconductor seed layer; forming an amorphous layer on the seed layer and the insulation layer; transforming the amorphous layer to a polycrystalline layer by exposing the amorphous layer to a first laser irradiation at a first energy level; and forming a single semiconductor crystalline film by annealing the polycrystalline layer and the semiconductor seed layer with a second laser irradiation at a second energy level.

24 Claims, 4 Drawing Sheets

METHOD OF FORMING A SEMICONDUCTOR THIN FILM

CROSS-REFERENCE TO RELATED APPLICATION

This application claims priority to application KR2006-0004334, filed on Jan. 16, 2006, the contents of which are incorporated by reference herein.

TECHNICAL FIELD

The present disclosure relates to a method of manufacturing a semiconductor thin film; in particular, a method of manufacturing a thin film using a semiconductor seed.

DISCUSSION OF RELATED ART

In general, crystalline materials may be classified as single-crystalline (or single crystal), polycrystalline (or poly-crystal) or as amorphous, or as combinations thereof, based on their crystal structure. A single crystalline material is one that has a single crystal unit structure, while a polycrystalline material has a structure comprising a plurality of crystal units. An amorphous material does not include a defined crystal structure, as atoms in amorphous materials may be irregularly bonded to each other. A polycrystalline material typically has many grain boundaries due to the plurality of crystal structure units. The movement of carriers such as electrons and holes may be restricted by these grain boundaries. Thus, electron conduction/mobility characteristics are superior in single crystalline materials, followed by polycrystalline materials, then amorphous crystalline materials. As such, single crystalline silicon layers are preferred to be used, for example, as the active regions of thin film transistors (TFT) that have a stacked structure.

A method of manufacturing single crystalline silicon thin film has been proposed in U.S. Pat. No. 6,746,942. The proposed method involves forming an amorphous silicon thin film on an insulation substrate, melting the amorphous thin film by irradiation of laser beams, forming a polycrystalline thin film when the melted thin film is recrystallized, heating the polycrystalline thin film by a second irradiation of laser beams at an intensity lower than that of the first irradiation, and at a temperature lower than the melting point of the polycrystalline thin film, to purportedly form a single crystalline thin film. In the method of forming a single crystalline thin film proposed in the '942 patent, the polycrystalline thin film formed by recrystallization from the melted amorphous thin film includes polycrystalline grains aligned in an approximate regular pattern and boundaries formed from multitude microprojections. When the polycrystalline thin film is subjected to the second laser irradiation at a temperature lower than the melting point of the polycrystalline silicon structure, the polycrystalline boundaries and microprojections are reduced, but because the polycrystalline structure is not melted, there exists regions of the thin film where the polycrystalline or even amorphous structure still remain. Electronic mobility through these regions may be lower than through other regions of the thin film.

Moreover, when the thin film is formed on an insulating substrate such as glass, a popular material used in forming components in LCDs owing to its optical transparency, the heat treatments employed to anneal the thin film may cause ablation and/or distortion in the substrate. In the proposed method of the '942 patent, the insulating material on which the thin film is formed by laser irradiation must be capable of withstanding the full amount of heat generated from the laser irradiation. If a low heat resistant type of glass is used as the insulating substrate, the substrate will likely distort in shape and ablation may be found between layers of the device.

A need therefore exists for a method of manufacturing a single crystalline semiconductor thin film with minimal defects. A need also exists for manufacturing the thin film in a way to reduce the heat stress placed on the insulating substrate.

SUMMARY OF THE INVENTION

A method of fabricating a semiconductor thin film is provided, comprising: forming an insulation layer on a semiconductor substrate; etching the insulation layer to form a plurality of openings exposing the substrate at the bottom of the openings; filling the openings with a semiconductor seed layer; forming an amorphous layer on the seed layer and the insulation layer; transforming the amorphous layer to a polycrystalline layer by exposing the amorphous layer to a first laser irradiation at a first energy level; and forming a single semiconductor crystalline film by annealing the polycrystalline layer and the semiconductor seed layer with a second laser irradiation at a second energy level, wherein the second energy level is higher than the first energy level.

According to an aspect of the invention, the first energy level is set to partially melt upper portions of the amorphous layer but leave lower portions of the amorphous layer contacting the seed layer in a solid state, and the second energy level is set to at least partially melt both the polycrystalline layer and the seed layer. The amorphous layer is about 10 nm to about 1000 nm in thickness and the first energy level is about 200 to about 700 millijoules/square cm and the second energy level is greater than 700 millijoules/square cm. The laser can be an excimer laser, a solid state laser, or a CW laser.

According to another aspect of the invention, the openings are dimensioned to facilitate a predominant portion of thermal flow from the second laser irradiation as compared to the portion of thermal flow through the insulation layer, wherein the openings exposing the substrate is about 10 to about 100 nm in diameter or width and length, and the insulation layer is about 200 to about 1000 nm in thickness, and the second energy level is about 700 to 3,000 millijoules/square cm.

According to another aspect of the invention, the semiconductor seed layer is formed by selective epitaxial growth from the substrate. Alternatively, the step of filling the openings include depositing semiconductor material that is the same as the semiconductor material of the substrate, then SEG is performed. The semiconductive material in the substrate can be silicon or germanium.

According to an exemplary embodiment of the invention, a method of fabricating a semiconductor thin film is provided, comprising: forming an insulation layer on a semiconductor substrate; etching the insulation layer to form a plurality of openings exposing the substrate; forming a semiconductor seed layer in the openings; forming a polycrystalline silicon layer on the seed layer and the insulation layer; and annealing the polycrystalline layer and the silicon seed layer to form a single crystalline film.

According to this aspect of the invention, the step of forming a polycrystalline silicon layer includes: depositing a non-single crystalline layer on the seed layer and the insulation layer and subjecting the non-single crystalline layer to laser irradiation at a first energy level. The step of annealing includes subjecting the polycrystalline silicon layer to laser irradiation at a second energy level, the second energy level is higher than the first energy level. The first energy level is set to at least partially melt the non-single crystalline layer. The second energy level is set to at least partially melt both the polycrystalline layer and the seed layer. The non-single crystalline layer is an amorphous semiconductor layer.

The semiconductor seed layer is preferably formed by selective epitaxial growth from the semiconductor substrate or from deposit in the opening of a semiconductor material the same as the semiconductor material in the substrate.

A semiconductor thin film device is also provided, comprising: a substrate having a semiconductive material; an insulating layer formed on the substrate, the insulation layer having a plurality of trenches that extend from the top to the bottom of the insulating layer; and a thin film formed on the insulating layer, wherein the thin film and the trenches comprise the semiconductive material with a single crystalline structure. The semiconductive material is silicon or germanium.

DETAILED DESCRIPTION OF PREFERRED EMBODIMENTS

Preferred embodiments of the present invention are described with reference to the accompanying drawings.

Figure 1A:
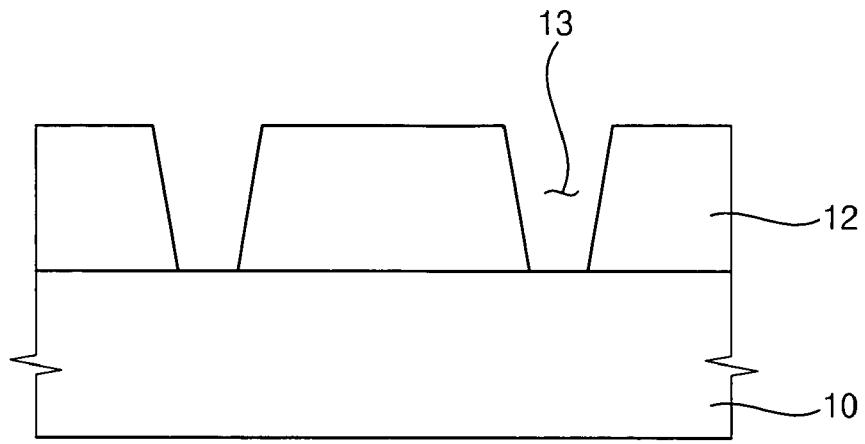
FIGS. 1A to 1G are cross-sectional views illustrating steps of manufacturing a semiconductor device according to an exemplary embodiment of the present invention.

As shown in FIG. 1A, an insulation layer 12, such as an oxide layer, is formed on a semiconductor substrate 10. An etching process is performed on the insulation layer 12 using a photoresist pattern as an etching mask to form openings 13. The openings (or trenches) 13 are formed so that at the bottom of the openings are the exposed surfaces of the substrate 10. The semiconductor substrate 10 comprises a single crystalline semiconductive material such as silicon, germanium or the like. For purposes of illustrating the embodiments of the present invention, silicon is used as the semiconductive material.

Figure 1B:
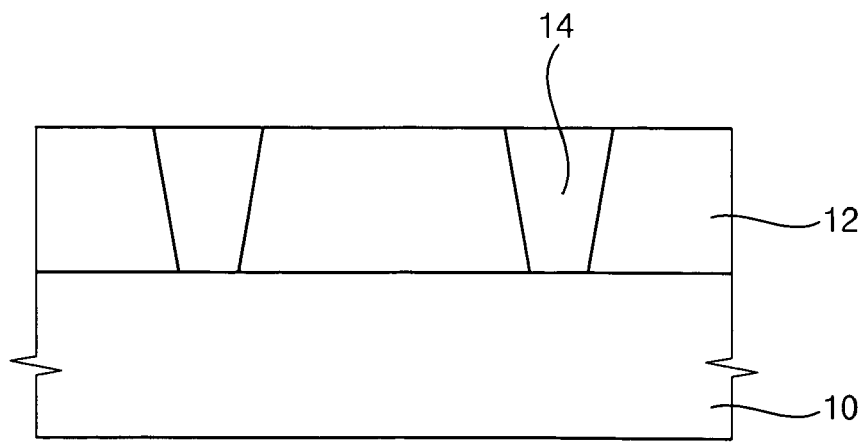

Referring to FIG. 1B, the openings 13 are filled with a semiconductive seed layer 14. According to the present embodiment, the semiconductor seed layer 14 is formed by growth from the exposed portions of the semiconductor substrate 10 through the bottoms of the openings 13, e.g., by performing a Selective Epitaxial Growth (SEG) process. The seed layer 14 formed by SEG from the semiconductor substrate 10 is a single crystalline epitaxial layer having the same material as the material of the semiconductor substrate 10, which in this embodiment, is silicon. According to an alternative embodiment of the present invention, the seed layer 14 can be formed by filling the openings 13 with e material the same as the material of the substrate 10. Then, the seed layer 14 can be grown from the deposited material to fill the openings.

Figure 1C:
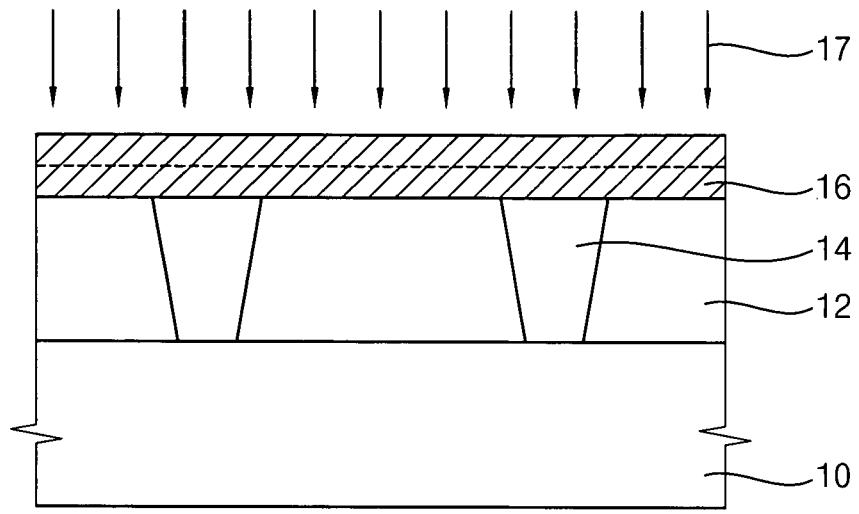

Shown in FIG. 1C, a non-single crystalline layer, i.e., a layer which does not have a defined crystalline structure, such as in an amorphous silicon layer 16, is formed on the insulation layer 12 and the seed layer 14 using, for example, a Chemical Vapor Deposition (CVD) process. The amorphous silicon layer 16 can be of various thicknesses. In an illustrative embodiment of the present invention, the amorphous silicon layer ranges from about 10 nm to about 1,000 nm in thickness. Preferably, the amorphous silicon layer is between about 20 nm to about 500 nm.

When the amorphous silicon layer 16 on top of the seed layer 14 is heated to a partially melted condition, such as by exposure to laser irradiation, the amorphous layer transforms to a layer having a polycrystalline structure. According to an embodiment of the present invention, the amorphous silicon layer 16 is exposed to laser irradiation at an energy level to heat the amorphous silicon layer 16 to a temperature equal to or higher than the melting point of the amorphous silicon.

Figure 1D:
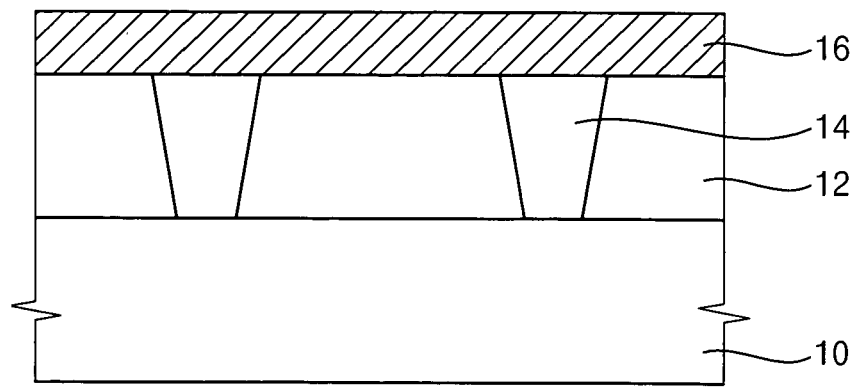
Figure 1E:
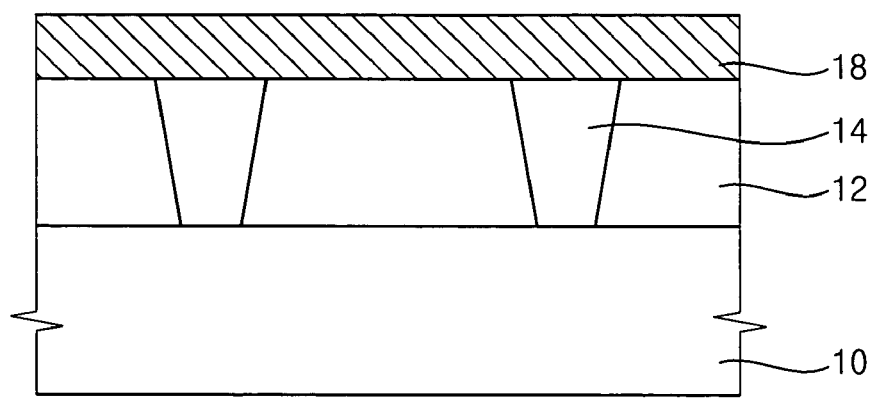

FIG. 1D illustrates the amorphous silicon layer 16 being exposed to a first laser irradiation 17. According to an embodiment of the present invention, the first laser irradiation 17 is set to an energy level so that the amorphous layer 16 is melted at the upper portion of the amorphous layer and the lower portion of the amorphous layer 16 contacting the seed layer 14 remains in a solid state. When the melted amorphous silicon recrystalizes, a silicon layer 18 having polycrystalline structure, i.e., grains aligned in an approximately regular pattern with multiple defined boundaries, is formed. The forming of the polycrystalline silicon layer 18 is shown in FIG. 1E.

According to the present illustrative embodiment, a solid state excimer laser irradiating at a range of about 200 to about 2,000 millijoules per square cm is used; more preferably, the laser irradiates at a range of about 200 to about 700 millijoules per square cm. Alternatively, a solid state or a CW laser may also be used.

Figure 1F:
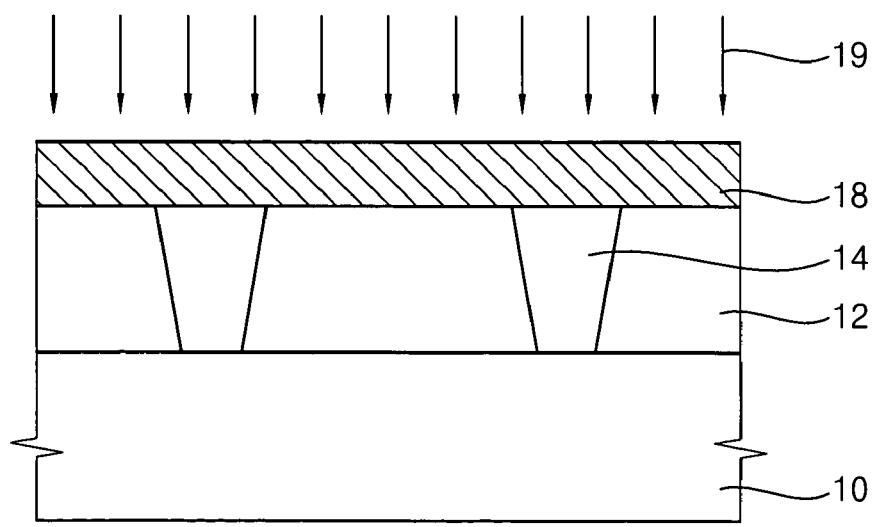
Figure 1G:
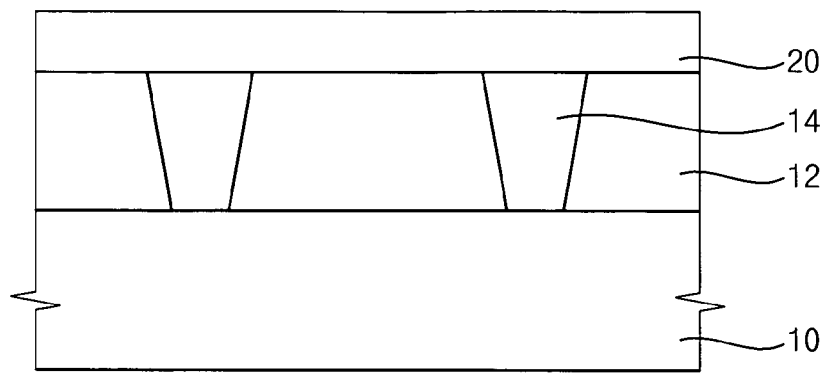

A single crystalline layer can be formed by exposing the polycrystalline layer 18 to a second laser irradiation. As shown in FIG. 1F, the polycrystalline layer 18 is exposed to a second laser irradiation 19. The second laser irradiation 19 is set to irradiate at a higher energy level than the first laser irradiation 17. According to an embodiment of the present invention, the higher energy level of the second laser irradiation 19 should heat the device to a temperature beyond the melting point of the polycrystalline silicon structure, sufficient to anneal both the polycrystalline layer 18 and the seed layer 14. The bonding of the melted polycrystalline silicon structure and the single crystal silicon seed material in layer 14 transforms the polycrystalline layer to a single crystalline layer 20 upon recrystalization, as shown in FIG. 1G. According to the present illustrative embodiment of the present invention, the second laser irradiation 19 is set at an energy level greater than 700 millijoules/square cm; more preferably, the energy level ranges from 800 to about 3,000 millijoules/square cm. According to another embodiment of the present invention, the openings 13 exposing the substrate 10 at the bottom of the openings is about 10 nm to about 100 nm in diameter or width and length and the insulation layer is about 200 nm to about 1,000 nm in thickness.

It is noted that the silicon seed layer 14 formed in the openings 14 serves various functions including: (1) the provision of single crystal silicon seed material to bond with the polycrystalline silicon material in layer 18 when the device is heated by the second laser irradiation and upon recrystalization, a silicon thin film having a single crystalline structure is formed; and (2) the provision of a thermal conduit from the polycrystalline layer, through the seed layer 14, to the substrate 10. Heat generated from laser irradiation that often become trapped between the top layer and the insulation layer can be alleviated through the thermal conduit to the substrate 10. In operation, the thermal flow through the thermal conduit predominates the thermal flow through the insulation layer. Thus, the defect caused by insulation layer distortion and ablation between layers from the trapped heat is minimized.

Figure 2:
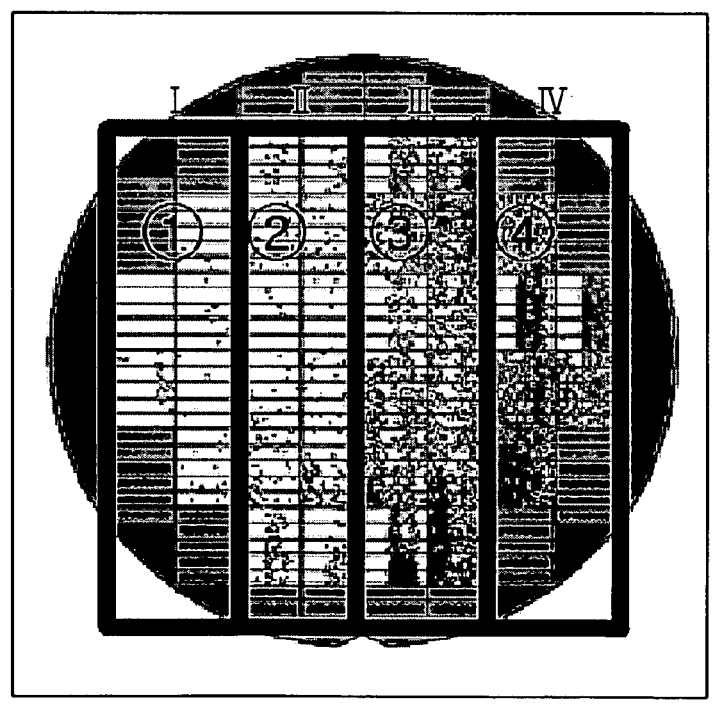
FIG. 2 shows a view of a thin film semiconductor device upon completion of laser irradiation at various energy levels.

FIG. 2 shows a view of a thin film device made in accordance with at least one embodiment of methods of the present invention. The view of FIG. 2 correspond to the listing in Table I with data from the thin film device after it has been subjected to first and second laser irradiations at various energy density levels.

TABLE I

| Region | 1'st laser | 2'nd laser | defects |
|--------|-----------|-----------|---------|
| Region1 | 700 J/Cm2 | 950 J/Cm2 | 12 ea |
| Region2 | 700 J/Cm2 | 1000 J/Cm2 | 74 ea |
| Region3 | 800 J/Cm2 | 950 J/Cm2 | 442 ea |
| Region4 | 800 J/Cm2 | 1000 J/Cm2 | 512 ea |

It can be seen from Table I that the number of defects can be reduced with optimized levels of energy applied from the laser irradiation.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences form the literal language of the claims.

What is claimed is:

1. A method of fabricating a semiconductor thin film, comprising:
    forming an insulation layer on a semiconductor substrate;
    etching the insulation layer to form a plurality of openings exposing the substrate at the bottom of the openings;
    filling the openings with a semiconductor seed layer;
    forming an amorphous layer on the seed layer and the insulation layer;
    transforming the amorphous layer to a polycrystalline layer by exposing the amorphous layer to a first laser irradiation at a first energy level; and
    forming a single semiconductor crystalline film by annealing the polycrystalline layer and the semiconductor seed layer with a second laser irradiation at a second energy level.

2. The method of claim 1, wherein the second energy level is higher than the first energy level.

3. The method of claim 1, wherein the first energy level is set to partially melt upper portions of the amorphous layer but leave lower portions of the amorphous layer contacting the seed layer in a solid state.

4. The method of claim 1, wherein the second energy level is set to at least partially melt both the polycrystalline layer and the seed layer.

5. The method of claim 1, wherein the amorphous layer is about 10 nm to about 1000 nm in thickness and the first energy level is about 200 to about 700 millijoules/square cm and the second energy level is greater than 700 millijoules/square cm.

6. The method of claim 1, wherein the laser is an excimer laser, a solid state laser, or a CW laser.

7. The method of claim 1, wherein the openings are dimensioned to facilitate a predominant portion of thermal flow from the second laser irradiation as compared to the portion of thermal flow through the insulation layer.

8. The method of claim 7, wherein the openings exposing the substrate is about 10 nm to about 100 nm in diameter or width and length.

9. The method of claim 1, wherein the insulation layer is about 200 nm to about 1000 nm in thickness, and the second energy level is about 700 to 3,000 millijoules/square cm.

10. The method of claim 1, wherein the step of filling the openings include depositing semiconductor material that is the same as the semiconductor material of the substrate.

11. The method of claim 1, wherein the semiconductor seed layer is formed by selective epitaxial growth from the substrate.

12. The method of claim 1, wherein the semiconductor is silicon or germanium.

13. A method of fabricating a semiconductor thin film comprising:
    forming an insulation layer on a semiconductor substrate;
    etching the insulation layer to form a plurality of openings exposing the substrate;
    forming a semiconductor seed layer in the openings;
    forming a polycrystalline silicon layer on the seed layer and the insulation layer; and
    annealing the polycrystalline layer and the silicon seed layer to form a single crystalline film.

14. The method of claim 13, wherein the step of forming a polycrystalline silicon layer includes:
    depositing a non-single crystalline layer on the seed layer and the insulation layer and subjecting the non-single crystalline layer to laser irradiation at a first energy level.

15. The method of claim 14, wherein the step of annealing includes subjecting the polycrystalline silicon layer to laser irradiation at a second energy level, the second energy level is higher than the first energy level.

16. The method of claim 13, wherein the first energy level is set to at least partially melt the non-single crystalline layer.

17. The method of claim 13, wherein the semiconductor seed layer is formed by selective epitaxial growth from the semiconductor substrate or from deposit in the opening of a semiconductor material the same as the semiconductor material in the substrate.

18. The method of claim 13, wherein the semiconductor is silicon or germanium.

19. The method of claim 13, wherein the non-single crystalline layer is an amorphous semiconductor layer.

20. The method of claim 15, wherein the second energy level is set to at least partially melt both the polycrystalline layer and the seed layer.

21. The method of claim 15, wherein the openings are dimensioned to facilitate a predominant portion of thermal flow from the second laser irradiation as compared to the portion of thermal flow through the insulation layer.

22. The method of claim 13, wherein the non-single crystal me layer is about 10 nm to about 1000 nm in thickness and the first energy level is about 200 to about 700 millijoules/square cm and the second energy level is greater than 700 millijoules/square cm.

23. The method of claim 13, wherein the openings exposing the substrate is about 10 nm to about 100 nm in diameter or width and length and the insulation layer is about 200 nm to about 1,000 nm in thickness.

24. The method of claim 15, the second energy level is about 700 to 3,000 millijoules/square cm.

* * * * *